(12) United States Patent
Kim et al.

(10) Patent No.: US 8,847,267 B2
(45) Date of Patent: Sep. 30, 2014

(54) LIGHT EMITTING DIODE WITH METAL PILES AND MULTI-PASSIVATION LAYERS AND ITS MANUFACTURING METHOD

(75) Inventors: Sang Mook Kim, Gwangju (KR); Jong Hyeob Baek, Daejeon (KR); Gang Ho Kim, Gwangju (KR); Jung-In Kang, Gwangju (KR); Hong Seo Yom, Seoul (KR); Young Moon Yu, Seoul (KR)

(73) Assignee: Korea Photonics Technology Institute, Gwangju (KR)

( * ) Notice: Subject to any disclaimer, the term of this patent is extended or adjusted under 35 U.S.C. 154(b) by 964 days.

(21) Appl. No.: 12/672,404

(22) PCT Filed: Aug. 7, 2008

(86) PCT No.: PCT/KR2008/004607
§ 371 (c)(1),
(2), (4) Date: Apr. 6, 2011

(87) PCT Pub. No.: WO2009/020365
PCT Pub. Date: Feb. 12, 2009

(65) Prior Publication Data
US 2011/0198635 A1 Aug. 18, 2011

(30) Foreign Application Priority Data
Aug. 8, 2007 (KR) .................. 10-2007-0079741

(51) Int. Cl.
*H01L 33/00* (2010.01)
*H01L 33/38* (2010.01)
*H01L 33/46* (2010.01)

(52) U.S. Cl.
CPC .............. *H01L 33/385* (2013.01); *H01L 33/46* (2013.01); *H01L 2933/0016* (2013.01)
USPC .......... 257/99; 257/81; 257/79; 257/E33.062; 257/E33.001; 257/E33.065

(58) Field of Classification Search
CPC .............................. H01L 33/62; H01L 33/486
USPC ........................................ 257/81, 99, E33.062
See application file for complete search history.

(56) References Cited

U.S. PATENT DOCUMENTS

2002/0171087 A1* 11/2002 Krames et al. .................. 257/81
2005/0104080 A1* 5/2005 Ichihara et al. .................. 257/98
(Continued)

FOREIGN PATENT DOCUMENTS

JP 2006-147629 6/2006
KR 10-2003-0073054 9/2003
(Continued)

*Primary Examiner* — Ha Tran T Nguyen
*Assistant Examiner* — Aaron Dehne
(74) *Attorney, Agent, or Firm* — Dilworth & Barrese, LLP

(57) ABSTRACT

The present invention relates to a light emitting diode with metal piles and one or more passivation layers and a method for making the diode including a first steps of performing mesa etching respectively on a first semiconductor layer and a second semiconductor layer belonging to stacked layers formed on a substrate in sequence! a second step of forming a reflector layer on the mesa-etched upper and side face! a third step of contacting one or more first electrodes with the first semiconductor layer and one or more second electrodes through the reflector layer with the second semiconductor layer; a fourth step of forming a first passivation layer on the reflector layer and the contacted electrodes; and a fifth step of connecting the first electrodes to a first bonding pad through one or more first electrode lines, bring one ends of vertical extensions having the shape of a metal pile into contact with one or more second electrodes, and connecting the other ends of the vertical extensions to a second bonding pad through one or more second electrode lines. As effects of the present invention, the loss of light emitting area decreases and current diffusion efficiency increases.

14 Claims, 11 Drawing Sheets

(56) References Cited

U.S. PATENT DOCUMENTS

| | | | |
|---|---|---|---|
| 2005/0194605 A1* | 9/2005 | Shelton et al. | 257/99 |
| 2007/0126016 A1* | 6/2007 | Chen et al. | 257/96 |
| 2007/0170596 A1* | 7/2007 | Wen et al. | 257/777 |
| 2007/0295952 A1* | 12/2007 | Jang et al. | 257/15 |

FOREIGN PATENT DOCUMENTS

| | | |
|---|---|---|
| KR | 10-2006-0115741 | 11/2006 |
| KR | 10-2007-0079956 | 8/2007 |
| WO | 2005/101598 | 10/2005 |

* cited by examiner

LIGHT EMITTING DIODE WITH METAL PILES AND MULTI-PASSIVATION LAYERS AND ITS MANUFACTURING METHOD

TECHNICAL FIELD

The present invention relates to a light emitting diode and its manufacturing method to enhance luminous efficiency by rearrangement of metal pads adopting metal piles and multi-passivation layers.

In addition, the present invention of pad rearrangement relates to chip scale package of light emitting diode and its manufacturing method. In detail, the present invention may be embodied as a light emitting diode with n type and p type semiconductor layers on a substrate and its manufacturing method, particularly including a primary electrode provided on a semiconductor layer, and a secondary electrode, which is electrically connected to the primary electrode, with a first passivation interposed between the electrodes.

BACKGROUND ART

Conventional flip chip semiconductor light emitting diodes are generally used because of high current diffusion efficiency and optical extraction efficiency, and excellent thermal characteristics with a silicon sub mount (see FIG. 1).

However, the flip chip semiconductor light emitting diodes have problems such as loss of active layer area caused by mesa-etching and drop of reflector layer efficiency caused by metal pads formed with big size.

In addition, though vertical type chip structure, which is recently developed by removing a sapphire substrate, has advantages of brightness enhancement due to increased light emitting area as compared with a lateral type light emitting diode, there are problems such as degradation of electrical characteristics and reliability due to a problem of ohmic contact formed between a N contact pad and a n type semiconductor layer at the area where the substrate is removed.

In addition, conventional nitride semiconductor light emitting diodes generally have a sapphire substrate, and on that, a layer sequence of a buffer layer, a n type nitride semiconductor layer, an active layer of multiple quantum well (MQW), a p type nitride semiconductor are formed in sequence. The p type nitride semiconductor layer and the active layer have the structure that a part of their area is eliminated with processes such as etching, thus exposing a part of the upper side of the n type nitride semiconductor. An n type electrode is formed on the exposed n type nitride semiconductor layer, and a p type bonding electrode is formed after a transparent electrode is formed to make ohmic contact on the p type nitride semiconductor layer.

A light emitting diode made with a conventional manufacturing process may be bonded on sub mount substrate made of silicon or ceramic as a package type for practical use or mounted on other types of packages.

Processes such as die bonding to bond the light emitting diode with these package materials and wire bonding for injecting electrons and holes are essential to a conventional light emitting diode manufacturing method.

FIG. 10 shows a sectional diagram of a light emitting diode stacked in the conventional light emitting diode manufacturing process, and the picture of electrons and holes movement.

Referring to FIG. 10, on a sapphire substrate 1100, an n type nitride semiconductor layer 1101, an active layer 1102 of multiple quantum well, a p type nitride semiconductor 1103 are formed in sequence. A p type electrode 1104 is located on the p type nitride semiconductor layer 1103, and an n type electrode is located on an exposed area, formed after etching, of the n type nitride semiconductor layer 1101.

The p type electrode and the n type electrode has a structure for being connected to PCB or other packages with wire 1106.

Generally, a buffer layer working as a buffer may be included between a substrate and a semiconductor layer in a conventional structure.

Referring to FIG. 10, electrons and holes from different semiconductor areas come together in the active layer, thus emitting light and generating it outside.

Due to the module structure made according to a conventional light emitting diode manufacturing method, the total thickness of a package gets thicker to cause problems of low optical extraction efficiency and performance, and also problems of yield and productivity related to complex processing.

Changing these package types may means a cost burden such as establishing a new production line. Therefore, it has been required to suggest improved structure of a light emitting diode module while maintaining current package types and processes.

DISCLOSURE

Technical Problem

The present invention has an object to provide a light emitting diode and its manufacturing method of a pad rearrangement structure including one or more metal piles and one or more passivation layers to enhance brightness, electrical characteristics and thermal characteristics by decreasing the mesa-etched area for n contact and relieving design restrictions applied to p contact to solve current diffusion problems of the conventional technology.

In addition, another object of the present invention is to apply a pad rearrangement structure, for solving efficiency and productivity problems of a conventional light emitting diode, to light emitting chips or light emitting diodes so as to finish the first half of entire packaging processes and be ready for mounting at the steps of making light emitting chips.

Another object of the present invention relates to applying a pad rearrangement structure to chip scale package based light emitting diodes having decreased package thickness with a flexible structure.

Another object of the present invention relates to applying the invention of a pad rearrangement structure to a light emitting diode manufacturing method for eliminating conventional wire bonding and die bonding to simplify light emitting diode manufacturing process, and thus save manufacturing cost and improve productivity.

Technical Solution

To achieve the objects, the light emitting diode and it manufacturing method of a pad rearrangement structure includes the step of forming mesa etching face of semiconductors and a first electrode line for current diffusion, forming a first passivation layer to insulate the line, and forming a second electrode line for bonding and thus improves the efficiency of the light emitting diode.

The present invention includes a first step of performing mesa etching on a first semiconductor layer and a second semiconductor layer which are stacked in sequence, a second step of forming a reflector layer on the mesa etched upper and side face, and a third step of contacting one or more first electrodes with the first semiconductor layer and one or more second electrodes through the upper face of the reflector layer. In addition, it is preferable to include a fourth step of forming a first passivation layer on the area except the first and second electrodes contacted respectively, and a fifth step of connecting the first electrodes with a first bonding pad through one or more first electrode lines, and a vertical extension, in the shape of a metal pile, of one or more second electrodes with a second bonding pad through one or more second electrode lines. On this occasion, the thickness of the passivation layer needs to be equal to or greater than 1 um, preferably 100 um to achieve the device rigidity required in case that the substrate is removed.

It is preferable that the first passivation layer is formed with two films made of same or different material. On this occasion, the thickness of the passivation layer needs to be 1 um or more, preferably 100 um to achieve the rigidity of the device required in case that the substrate is removed.

It is preferable to include a step of forming a second passivation layer on the area except the first and second bonding pad area formed in the fifth step. On this occasion, the thickness of the passivation layer needs to be 1 um or more, preferably 100 um to achieve the rigidity of the device required in case that the substrate is removed. If surface roughening is applied to the second passivation layer, optical extraction efficiency can be increased.

It is preferable that the first and second bonding pads are formed with ion beam deposition or plating in the present invention.

It is preferable in the present invention that one or more holes are formed regularly or irregularly to a semiconductor layer belonging to a stacked layer sequence formed on one side of a substrate; one end of each electrode formed through the holes contacts with the semiconductor layer; and the other end of each electrode contacts with a bonding pad through one or more electrode lines.

It is preferable that the present invention comprises a reflector layer formed on the upper and side faces of mesa-etched semiconductor layers belonging to a layer sequence stacked on one side of a substrate, one or more first electrodes being contacted directly with the first semiconductor layer as a mesa-etched lowered layer, and one or more second electrodes, being preferably textured regularly or irregularly, contacted directly with the second semiconductor layer under the reflector layer. In addition, it is preferable that the present invention includes one or more first electrode lines, formed on the upper side of the reflector layer, connected with the first electrodes in sequence, one or more second electrode lines connected with the second electrodes via vertical extensions, in the shape of a metal pile, of the second electrodes in sequence, and a first bonding pad gathering the first electrode lines and a second bonding pad gathering the second electrode lines respectively.

It is preferable in the present invention that the first electrode, the first electrode lines and the first bonding pad have same polarity.

It is preferable in the present invention that the second electrode, the second electrode lines and the second bonding pad have same polarity.

It is preferable in the present invention that the first electrode and the second electrode have different polarity.

The present invention may be embodied in the structure of a light emitting diode including a first semiconductor layer and a second semiconductor layer, belonging to a layer sequence stacked on a substrate in sequence, being mesa-etched respectively; a reflector layer formed on upper and lateral surfaces of the mesa etched second semiconductor layer; one or more first electrodes contacted directly with the mesa etched first semiconductor layer as a lowered layer; one or more second electrodes contacted directly with the mesa etched second semiconductor layer under the reflector layer; a first passivation layer formed on the upper side of the reflector layer; one or more first electrode lines formed on the first passivation layer; and one or more second electrode lines contacted with one or more vertical extensions, in the shape of a metal pile and exposed on the passivation layers, of one or more second electrodes. In case that only one first electrode line and only one second electrode line exist, each electrode line may be prepared to be used as a bonding pad (see FIG. 19).

As another embodiment of the present invention, in case that the light emitting diode has one or more first electrode lines, the first electrodes lines may gather together into any one line among the lines and the only one first electrode line may act as a bonding pad. In the same manner, one or more second electrode lines may gather together into any one line among the lines and the only one second electrode line may act as a bonding pad. On this occasion, the first electrode and the second electrode have different polarity.

As another embodiment of the present invention, the light emitting diode may further include a first bonding pad gathering the first electrode lines, and a second bonding pad gathering the second electrode lines respectively. As one of advantages according to this embodiment, bonding pad design may be easier in comparison with the previous embodiment of the first electrode lines or the second electrode lines gathering to any one line among the lines respectively. On this occasion, the first electrode and the second electrode have different polarity.

Another embodiment of the present invention may further includes holes formed regularly or irregularly on the first passivation layer of the light emitting diode, and one or more vertical extensions having the shape of a metal pile in the holes, wherein one ends of the parts are contacted with the first semiconductor layer and other ends of the parts are exposed on the passivation layer and contacted with one or more first electrode lines. In the same manner, the second electrodes may have vertical extensions having the shape of a metal pile like that of the first electrodes. This structure enhances the degree of evenness.

The present invention of pad rearrangement may be applied to chip scale package of light emitting diodes and its manufacturing method. In particular, it may be applied to a light emitting diode chip and its manufacturing method having an n type semiconductor layer and a p type semiconductor on a substrate includes n type electrodes and p type electrodes placed on semiconductor layers, n type electrode line extensions and p type electrode line extensions electrically connected with the n type electrodes and the p type electrodes through interposed first passivation layer and they may be acting as bonding pads.

In case that the construction of pad rearrangement applies to chip scale package based light emitting diodes, it is possible to simplify light emitting diode manufacturing process, save the manufacturing cost due to eliminating conventional wire bonding and die bonding, and enhance luminous efficiency with decreased thickness of package. In addition, the light emitting diode formed with the construction has advantages of being ready to be mounted to other packages and PCBs without additional preparation.

To achieve the effect as an object of the present invention, the embodiment of the present invention of a light emitting diode including an n type semiconductor layer and a p type semiconductor on a substrate may comprise n type electrodes on an n type semiconductor layer and p type electrodes on a p type semiconductor layer, n type electrode line extensions electrically connected with the n type electrodes and p type electrode line extensions electrically connected with the p type electrodes passing through interposed first passivation layer.

The first passivation layer may be formed with one or more materials selected from the group consisting of polyimide, epoxy resin and SOG (Spin on glass).

The p type second electrodes formed on the p type semiconductor layer may be placed on a reflector layer made of materials to enhance optical reflection. The reflector layer is preferably a metal reflector layer made of metal.

Another embodiment of the present invention may further comprise a second passivation layer, made of glass or ceramic film, separating the first electrodes from the second electrodes.

To achieve the construction, a method of manufacturing a light emitting diode, in particular including an n type semiconductor layer and a p type semiconductor on a substrate, may comprise steps of forming n type electrodes on an n type semiconductor layer and p type electrodes on a p type semiconductor layer, and forming n type electrode line extensions electrically connected with the n type electrodes and p type electrode line extensions electrically connected with the p type electrodes passing through interposed first passivation layer.

The first passivation layer may be made of polyimide, epoxy resin, and SOG.

In the embodiment of manufacturing method of the present invention, the n type electrode line extension and p type electrode line extension may be formed on a second passivation layer, not the first passivation layer, made of glass of ceramic film.

Another embodiment of the present invention may further comprise a step of etching the first passivation layer or depositing after patterning to expose the part of the first electrodes to connect electrically the n type electrodes and n type electrode line extensions, and the p type electrodes and p type electrode line extensions respectively.

Another embodiment of the present invention may further comprise a step of forming glass or fluorescent layer after eliminating the substrate from the light emitting diode processed with the above mentioned steps.

Another embodiment of the present invention may further comprise a step of texturing one side of the substrate of the light emitting diode processed with the above mentioned steps, thus having regular or irregular prominence and depression.

Another embodiment of the present invention may further comprise a step of forming a metal reflector layer on the semiconductor layers for optical reflection before forming n type electrodes and p type electrodes on the semiconductor layers.

The semiconductor layers may be compound semiconductor, preferably nitride compound semiconductor layers.

The present invention may be applied to a light emitting diode having the construction to finish the first half processes of packaging at the level or step of chip making processes belonging to manufacturing method of a light emitting diode.

The light emitting diode according to the embodiment of the present invention is ready to be mounted on PCBs without additional preparation, which decreases thickness of a package and makes it possible to obtain a package with flexible structure.

In another embodiment of the present invention of a light emitting diode manufacturing method, a layer for n type electrodes and p type electrodes is deposited in the first place for the contact of the p type semiconductor layer and the contact of the n type semiconductor layer after mesa etching performed for the contact of the n type semiconductor layer.

On this occasion, a layer formed of material to enhance optical reflection around the contact area of the p type semiconductor layer is a reflector layer. The reflector layer, preferably a metal reflector layer, may be made of metal layer. The layer may be formed not only just around the contact area of the p type semiconductor layer but also broadly around outer stacked surface of the light emitting diode.

After performing the processes, a first passivation layer is formed before depositing the n type electrode line extensions and the p type electrode line extensions. The material for first passivation layer may be chosen from various material such as polyimide, epoxy, and SOG but not limited to the listed materials.

The shape of the n type electrode line extensions and the p type electrode line extensions is preferably rectangular form, but not limited to any specific shape.

On this occasion, etching or patterning processes are need to expose the upper part of the n type electrodes and the p type electrodes to the outside for making contact between the n type electrode line extensions and the n type electrodes on the n type semiconductor layer, and contact between the p type electrode line extensions and the p type electrodes on the p type semiconductor layer, respectively.

While depositing the first passivation layer after forming the n type electrodes and the p type electrodes, it is possible to open the area of the n type electrodes and the p type electrodes with patterning. Otherwise, after depositing the first passivation layer on the formed the n type electrodes and the p type electrodes, it is possible to open the area of the n type electrodes and the p type electrodes with etching the first passivation layer.

Because the n type electrode line extension and the p type electrode line extension respectively contacted with the n type electrode and the p type electrode through the vertical extensions having the shape of a metal pile may perform a role of bonding pads, it is preferable to decide the size and position of the pads in advance to be immediately mounted on other packages.

As occasion demands, a second passivation layer may be formed after forming the first electrode. As a second passivation layer, glass or ceramic film with high thermal conductivity may be adhered.

As a ceramic film, materials such as Boron nitride (BN), Alumina, Aluminum nitride (AlN), Beryllium oxide (BeO) or the like may be used.

In another embodiment of the present invention of a pad rearrangement construction, a light emitting element (chip) or a light emitting diode may be mounted without wire bonding or die bonding and the structure of prominence and depression may be formed on the one side of the substrate to enhance performance of the diode while layers are stacked on the other side of the substrate, In addition, the structure of prominence and depression may be made on the semiconductor layer after eliminating the substrate.

The structure of prominence and depression is formed with texturing processes. There are methods of using regular patterns or random patterns in texturing processes. As a method of using regular patterns, it is preferable to use nano imprinting, electron beam lithography and laser holograph. After forming the regular patterns, dry etching processes may be applied to form a texturing structure on the substrate or the semiconductor layer.

As a method of using random patterns, a texturing structure of random patterns may be formed with dry etching processes after forming cluster of nano size through heat treatment processes of metals such as Ag, Ni, Pt, Pd, or the like.

In addition, random texturing may be formed with wet chemical etching processes. In detail, random texturing structure may be formed on the substrate or the semiconductor layer after etching with a KOH solution.

A light emitting diode (chip) according to another embodiment of present invention may have additional layer such as glass or fluorescent layers to enhance optical extraction efficiency after eliminating a substrate with the method of LLO (Laser Lift Off) or the like.

The light emitting diode (chip) made with the method as described above may be separated to be used respectively with usual cutting methods which are generally available to a person having ordinary skill in the art. It may be preferably separated into pieces through dicing or scribing processes.

To package finished light emitting diodes of various embodiments according to the present invention, the diodes may be mounted directly, without additional preparations, to the solders formed on package materials such as PCBs, or other types of packages.

Advantageous Effects

According to the present invention, there is no need to add secondary bonding pads in addition to the pads already formed on mesa etched face because electrodes are formed on a same plane. Therefore, the number of pads decreases, and light absorption by the pads is prevented, thus enhancing optical power as a result.

Further, there is no direct contact between a reflector layer and bonding pads, thus resulting in the effect of decreasing the loss of the reflector layer.

Furthermore, an ohmic contact problem of vertical type chip is settled and similar performance to that of the vertical type chip is obtained in case of adding the process of eliminating a substrate.

In addition, as described above, the construction of the present invention of pad rearrangement may be applied to light emitting diodes, resulting in remarkably improved effect in productivity and manufacturing cost saving due to skipping wire bonding and die bonding processes by performing chip making and packaging processes at the same time directly on a substrate.

In addition, the construction of the present invention of pad rearrangement adopts processes of LLO, thus resulting in light emitting diodes having combined merits of a vertical integration type light emitting diodes and a lateral growth type light emitting diode and flexible structure with thin thickness.

In addition, the construction of the present invention of pad rearrangement may be applied to backlight units and compact lighting field requiring minimum size packaging, and further, light emitting diodes having various structures can made easily and simply through processes such as forming additional glass or fluorescent layer at the wafer processing level, thus generating economic value due to productivity and yield improvement.

Numerals of drawings are explained as follows;
  100: a substrate,
  110: a first semiconductor layer
  120: an active layer,
  130: a second semiconductor layer
  140: a reflector layer,
  150: a first electrode
  160: a second electrode,
  300: a first passivation layer
  310: a first electrode line,
  320: a second electrode line
  330: a first bonding pad,
  340: a second bonding pad
  350: a second passivation layer
  1100, 1200, 1300, 1400, 1500: a substrate
  1101, 1201, 1301, 1401, 1501: an n type semiconductor layer
  1102, 1202, 1302, 1402, 1502: an active layer
  1103, 1203, 1303, 1403, 1503: a p type semiconductor layer
  1104, 1204, 1304, 1404, 1504: a p type electrode (a second electrode)
  1105, 1205, 1305, 1405, 1505: a n type electrode (a first electrode)
  1106: wire
  1206, 1306, 1406, 1506: a metal reflector layer
  1207, 1307, 1407, 1507: a first passivation layer
  1208, 1308, 1408, 1508: a second passivation layer
  1209, 1309, 1409, 1509: a p type electrode line extension (a second electrode line extension)
  1210, 1310, 1410, 1510: an n type electrode line extension (a first electrode line extension)

BEST MODE

Embodiments of the present invention will be described in detail in reference to the drawings. Applying the numerals to the elements of the respective drawings, detailed description on conventional structure and function is abridged because that may be an obstacle to understanding of the spirit of the present invention.

Figure 1:
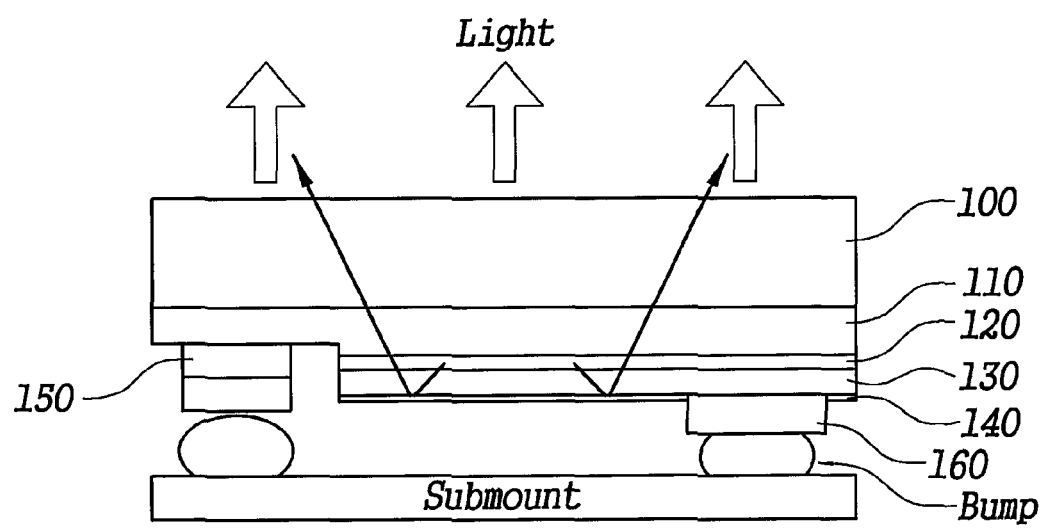
FIG. 1 is a cross-sectional view of a conventional light emitting diode.
Figure 2:
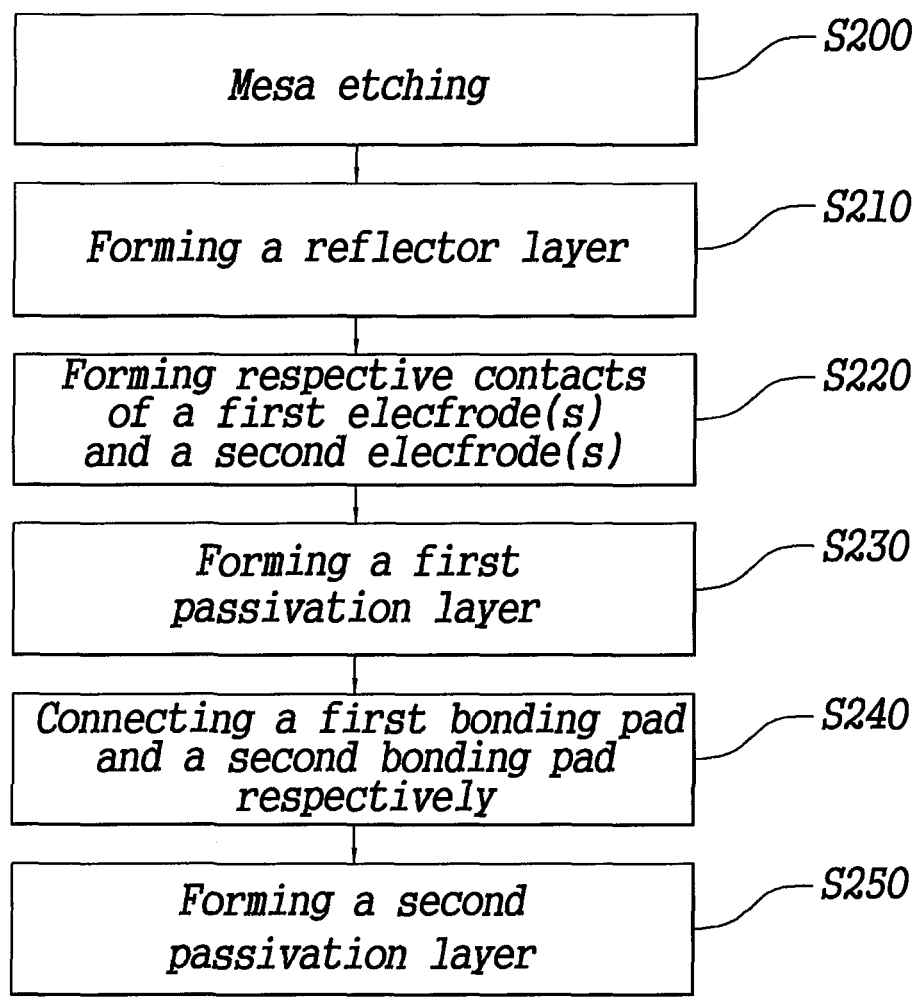
FIG. 2 is a flowchart illustrating a method of manufacturing a light emitting diode using pad rearrangement according to an embodiment of the present invention.

FIG. 2 is a flowchart illustrating a method of manufacturing a light emitting diode according to an embodiment of the present invention, and FIGS. 3 to 8 are schematic diagrams illustrating a method of manufacturing a light emitting diode according to an embodiment of the present invention.

Referring to FIG. 2, it may be preferable to use a sapphire substrate or a wafer for a substrate 100, and also to use nitride semiconductor for the semiconductor.

Figure 3:
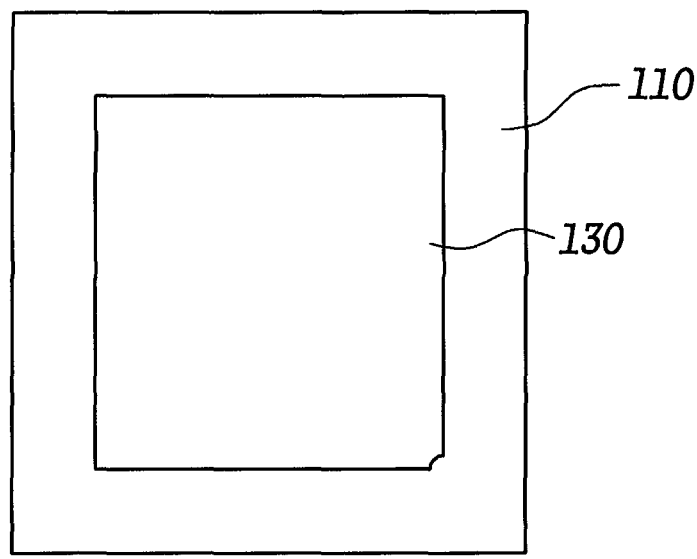
FIGS. 3, 4, 5, 6, 7 and 8 are schematic diagrams illustrating a method of manufacturing a light emitting diode using pad rearrangement according to an embodiment of the present invention.

Mesa etching is performed on narrow area instead of conventional wide area etching when mesa etching (S200) is performed to form a first electrode 150 in a semiconductor layer sequence stacked with a first semiconductor layer 110, an active layer 120, and a second semiconductor layer 130 in sequence on the substrate 100 (see FIG. 3).

Figure 4:
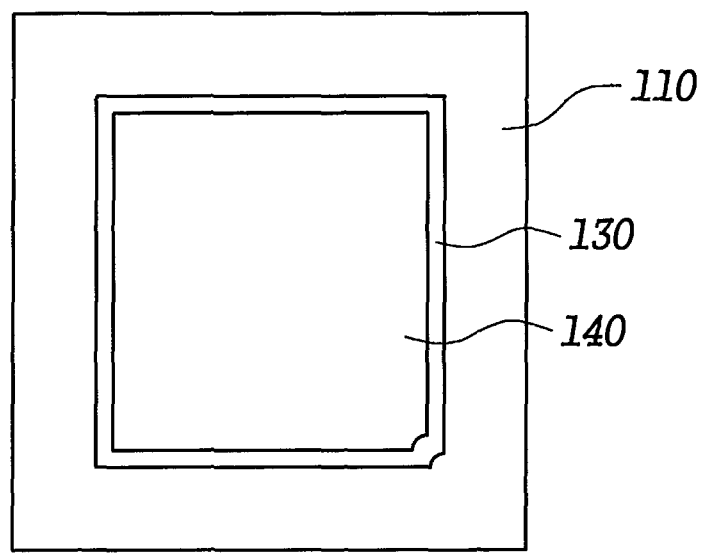

After mesa etching, a reflector layer 140 for ohmic contact and reflection is formed (S210) on the upper face of the second semiconductor layer 130 (see FIG. 4).

Figure 5:
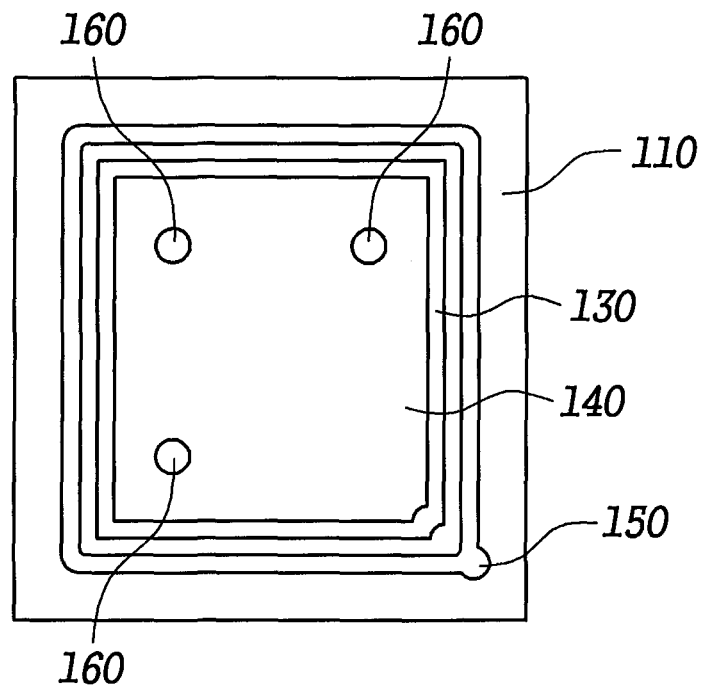

A first electrode 150 is directly connected with the upper face of the first semiconductor layer 110 and a second electrode 160 on the upper face of the reflector layer 140 is directly connected with the second semiconductor layer 130 (S220) (see FIG. 5).

On this occasion, the number of the first electrode 150 and the second electrode 160 may be a plurality of one or more. The electrodes are formed with very small size. Effective radiation area is increased with regular of irregular texturing as compared to a conventional chip, and optical power is enhanced.

Figure 6:
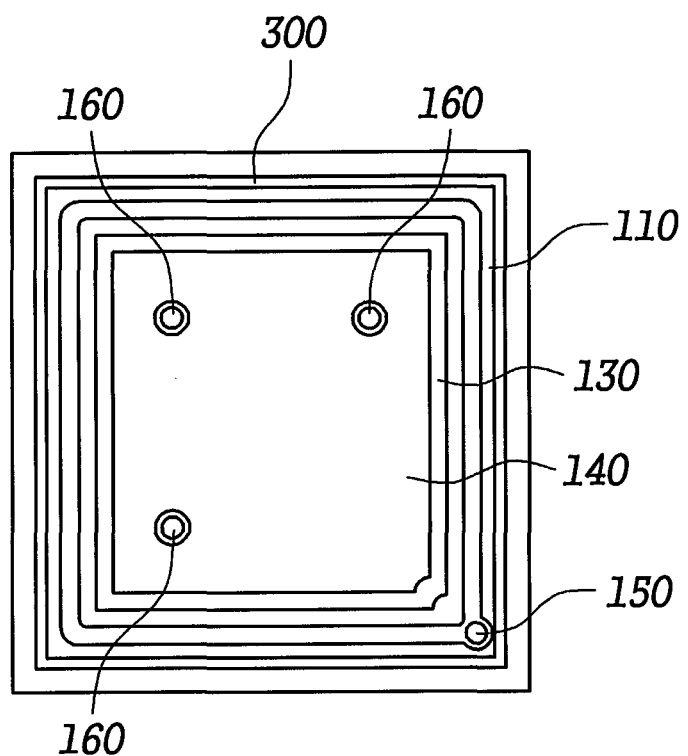
Figure 7:
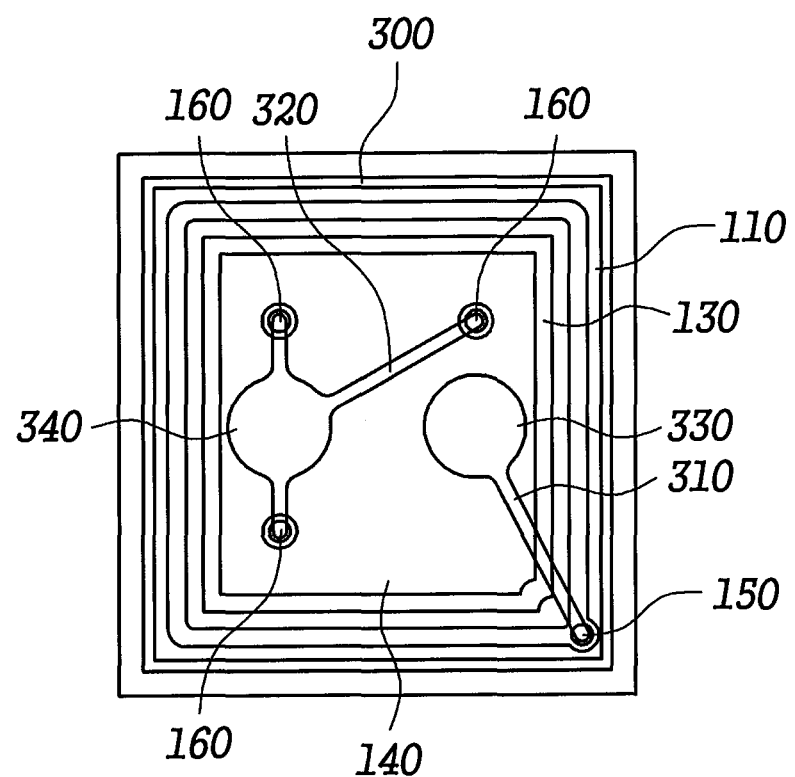

After performing the contact processes of the first electrodes 150 and the second electrodes 160 respectively, a first passivation layer 300 is formed (S230) on the area except the contact area of the first electrodes 150 and the second electrodes 160 (see FIG. 6).

The first passivation layer 350 may be formed of one passivation film or two passivation films. In case of forming the layer with two films, they may be made of same or different material.

One or more first electrodes 150 exposed on the upper face of the first passivation 350 is connected to a first bonding pad with one or more first electrode lines 310. One or more second electrodes 160 have vertical extensions (not shown in FIG. 7, refer to connection part between 1209 and 1204 of FIG. 14) having the shape of a metal pile, passing through the first passivation layer, which are exposed on the upper face of the first passivation layer. The extensions are connected (S240) to a second bonding pad 340 with the second electrode lines 320 (see FIG. 7).

On this occasion, the size of the bonding pads 330, 340 is not limited because it is irrelevant to luminous efficiency of a light emitting diode. The pads 330, 340 are formed with e-beam deposition or plating.

Figure 8:
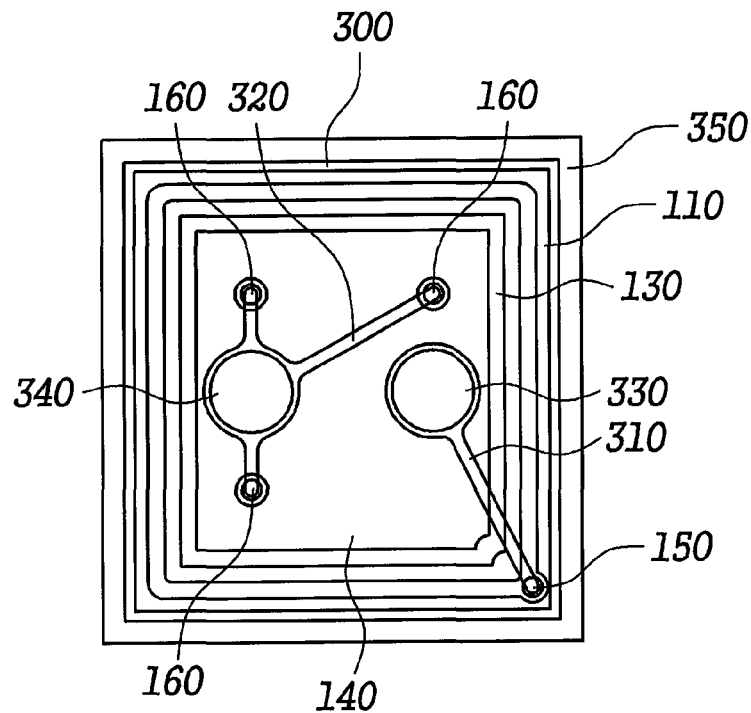

In stacked semiconductor layers formed according to the above mentioned processes, a second passivation layer 350 may be formed (S250) on the other area except the area of the first and second bonding pads 330,340 (see FIG. 8).

MODE FOR INVENTION

Figure 9:
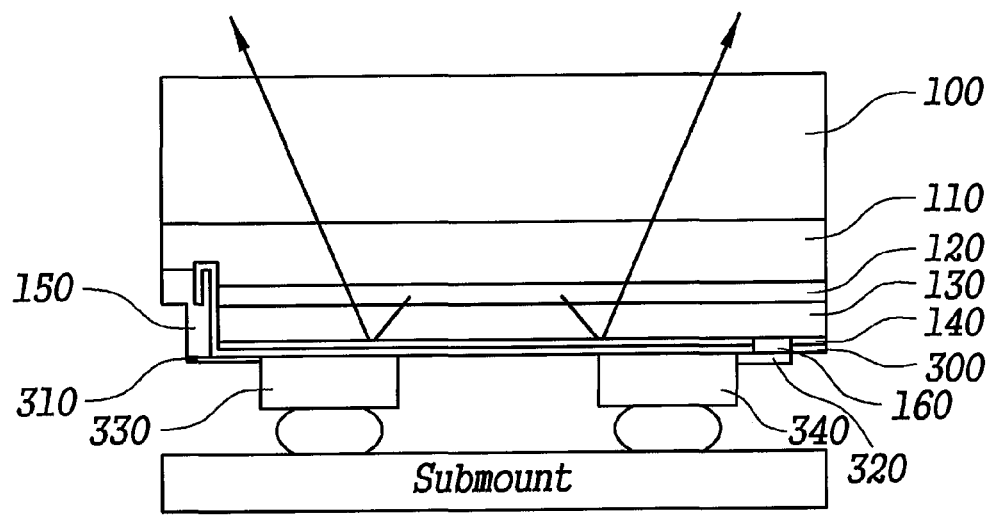
FIG. 9 is a cross-sectional view of a light emitting diode using pad rearrangement according to an embodiment of the present invention.
Figure 10:
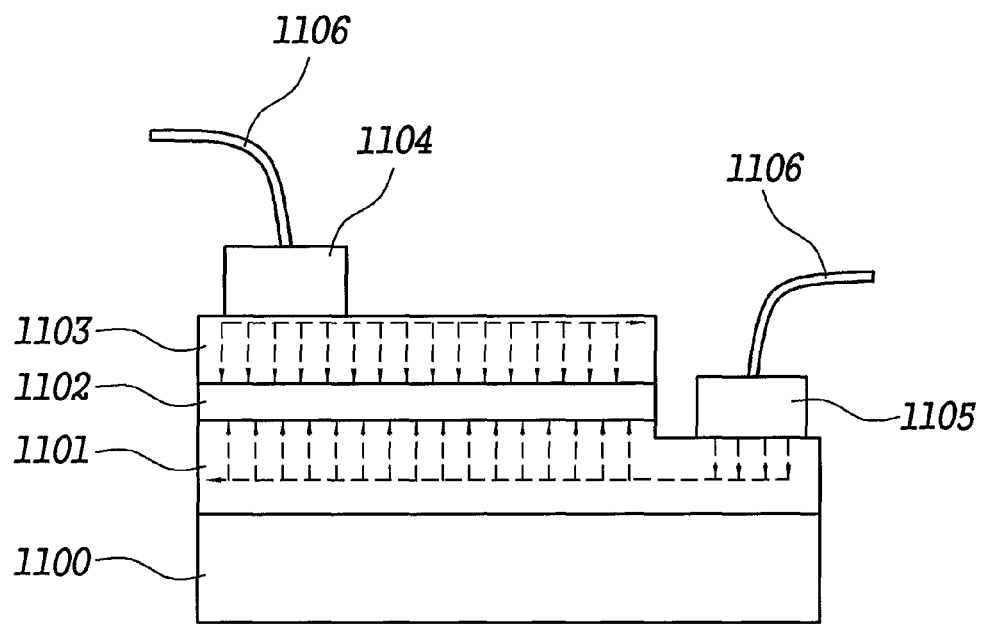
FIG. 10 is a cross-sectional view schematically illustrating an example of light emitting diodes according to conventional art.

FIG. 9 is a cross-sectional view of a light emitting diode with pad rearrangement according to an embodiment of the present invention.

Figure 19:
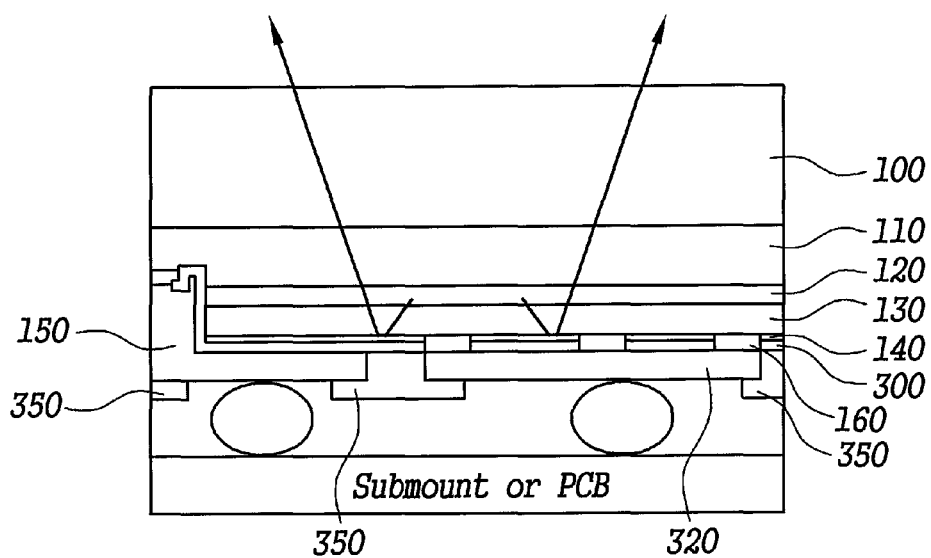
FIG. 19 is a cross-sectional view of a light emitting diode using pad rearrangement according to another embodiment of the present invention.

FIG. 9 shows a substrate 100, a first semiconductor layer 110, an active layer 120, a second semiconductor layer 130, a reflector layer 140, a first electrode 150, a second electrode 160, a first passivation layer 300, a first electrode line 310, a second electrode line 320, a first bonding pad 330, and a second bonding pad 340 (see FIG. 19).

The first semiconductor layer 110 and the second semiconductor layer 130 are made of GaN, and the layers are stacked on the substrate 100.

The active layer 120 is formed between the first semiconductor layer 110 and the second semiconductor layer 130.

The reflector layer 140 is formed on a part of stacked semiconductor layers which are formed of a first semiconductor layer 110, an active layer 120, and a second semiconductor layer 130 in sequence, except the lowered face prepared with mesa etching.

On this occasion, the lowered face formed with mesa etching belongs to a first semiconductor layer 110.

When electrical energy inputted to semiconductor layers is transformed into optical energy as output, the reflector layer 140 increases optical efficiency by reflecting light not to leak to the outside.

Particularly, because the second electrodes 160 are etched to be small size and connected to a second bonding pad 340, there is no direct contact between the reflector layer 140 and the bonding pad, which prevents the reflector layer 140 from being damaged.

The first electrode 150 and the second electrode 160 have opposite polarity each other, and the first electrode 150 is directly connected to the first semiconductor layer 110 exposed by the mesa etching.

The second electrode 160 may be located in holes formed in parts of the reflector layer 140 to directly contact the second semiconductor layer 130 placed under the reflector layer 140.

On this occasion, one or more first and second electrodes 150, 160 may be formed with small size, and textured regularly or irregularly.

A first passivation layer 300 protects a exposed first semiconductor layer 110 and the reflector layer 140, the area except the first and the second electrodes 150, 160 in other words, from external electrical influence when the first and the second electrodes 150, 160 are formed.

According to the structure, there is effect of enhanced optical power as effective light emitting area increases in contrast with a conventional light emitting diode.

The first electrode line 310 contacts one or more first electrodes, and the second electrode line 320 contacts one or more second electrodes through contacting with the vertical extensions having the shape of a metal pile.

The first bonding pad 330 electrically may combine one or more first electrodes 150 through contacting with the first electrode lines 310, and the second bonding pad 340 electrically may combine one or more second electrodes 160 through contacting with the second electrode lines 320.

Accordingly, one bonding pad may be placed on a semiconductor layer according to polarity, regardless of the size of the semiconductor area, thus preventing optical absorption and resulting in enhanced optical power.

In addition, there is no need to additionally form bonding pads on the first semiconductor layer 110 because the first electrode lines 310 are used.

While observing from the outside a light emitting diode chip with pad rearrangement according to another embodiment of the present invention, a metal reflector layer formed on the upper face of the light emitting diode and p type electrode line extensions contacted with p type second electrodes are shown.

A light emitting diode chip with pad rearrangement according to another embodiment of the present invention discloses the structure of n type electrode line extensions formed on a upper face, electrically connected to the n type first electrodes on an n type nitride semiconductor layer.

Therefore, after forming the n type electrode line extensions electrically connected to the n type first electrodes, chips may be are divided for obtaining respective light emitting diode. The divided chips may be directly mounted, which provides merits in processes.

A plurality of respective light emitting diode chips may be obtained after stacking in sequence layers of light emitting diode chips over large area, and chips with texturing structure on one side of themselves may be produced as occasion demands.

Figure 11:
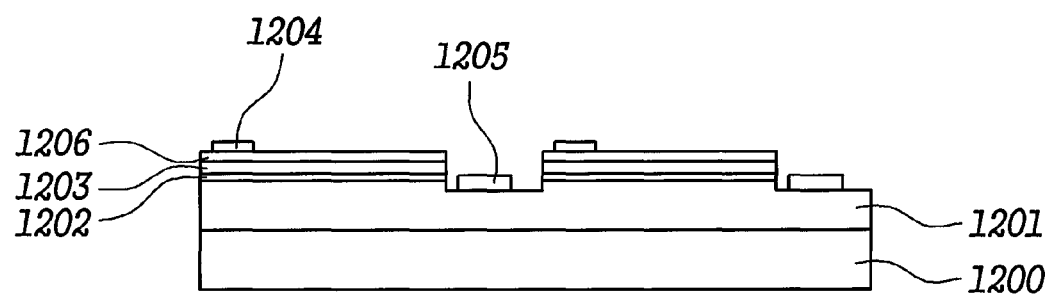
FIGS. 11 to 14 are schematic diagrams illustrating in sequence a method of manufacturing a light emitting diode with pad rearrangement according to another embodiment of the present invention.
Figure 12:
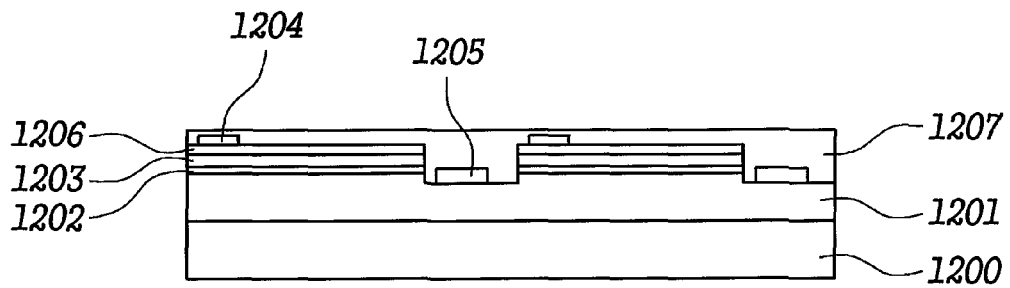

FIGS. 11 and 12 are cross-sectional views illustrating in sequence a method of manufacturing a light emitting diode according to another embodiment of the present invention.

FIG. 11 shows that electrodes are formed on respective semiconductor layers after exposing an n type semiconductor layer 1201 with etching some part of light emitting diode chips which are formed of an n type GaN compound semiconductor layer 1201, an active layer 1202 and a p type GaN compound semiconductor layer 1203 in sequence on the substrate 1200.

On this occasion, a first electrode as an n type electrode 1205 is formed on an n type GaN compound semiconductor layer 1201 and a second electrode as an p type electrode 1204 is formed on a p type GaN compound semiconductor layer 1203.

The light emitting diode may include a buffer layer additionally.

Further, the light emitting diode may include additionally a metal reflector layer 1206 to increase optical reflection between a second electrode and a p type GaN compound semiconductor layer.

At the next step shown in FIG. 12, a first passivation layer 1207 is stacked on the upper face of the whole light emitting diode including a second electrode 1204, a metal reflector layer 1206, a first electrode 1205, and semiconductor layers. The first passivation layer may be made of highly polymerized organic compounds and particularly epoxy resin may be used. On this occasion, the thickness of the passivation layer needs to be equal to or greater than 1 um, preferably 100 um for the rigidity of the device in case of eliminating a substrate.

A first passivation layer of the present invention may be preferably formed with two films made of same or different material. On this occasion, the whole thickness of the passivation layer needs to be equal to or greater than 1 um, preferably 100 um for the rigidity of the device in case of eliminating a substrate.

It may be preferable to have the step of forming a second passivation layer on the part except the first and second bonding pad area, following the fifth step of the present invention. On this occasion, the whole thickness of the passivation layer needs to be equal to or greater than 1 um, preferably 100 um for the rigidity of the device in case of eliminating a substrate. Optical extraction efficiency may be increased in case of applying surface roughening on the second passivation layer (see FIG. 19).

Figure 13:
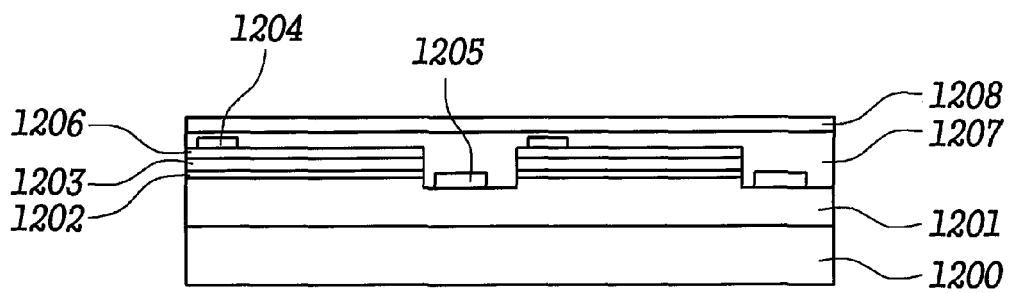

Referring to FIG. 13, a second passivation layer 1208 is formed on a first passivation layer 1207. Glass, silicon material, or the like may be used to the second passivation layer and this process may be skipped.

Figure 14:
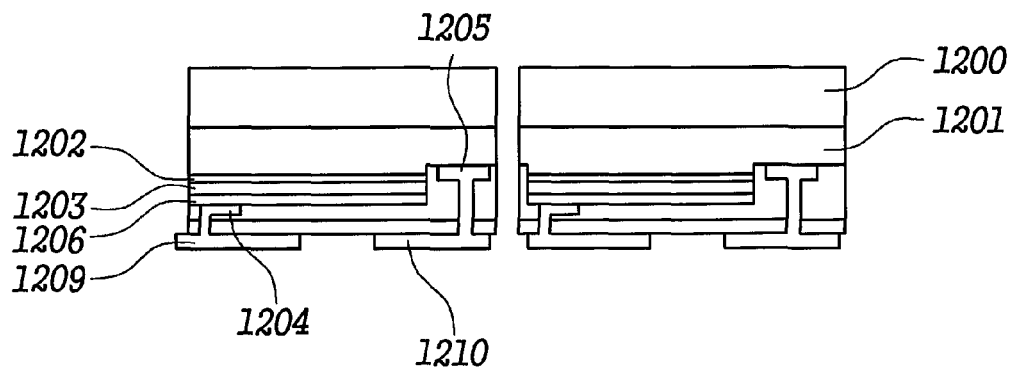

FIG. 14 shows that parts of the first electrodes and the second electrodes are exposed due to etching processes for respective electrical connect of the first electrodes 1205 and the second electrodes 204. Then, one ends of vertical extensions having the shape of a metal pile are respectively connected to the first electrodes and the second electrodes, and the other ends of the vertical extensions are respectively connected to the first electrode line extension and the second electrode line extension having the shape of a pad on the second passivation layer 1208. In other words, a p type electrode line extension 1209 is connected to the second electrode 1204 as a p type electrode, and a n type electrode line extension 1210 is connected to the first electrode 1204 as an n type electrode, respectively.

Light emitting diode chips formed in this way may be divided into respective chips by scribing or dicing processes according to required dimension and shape.

Each light emitting chip may be mounted to a package directly using the p type electrode line extension 1209 and the n type electrode line extension 1210 as contact points, that is to say or bonding pads.

Figure 15:
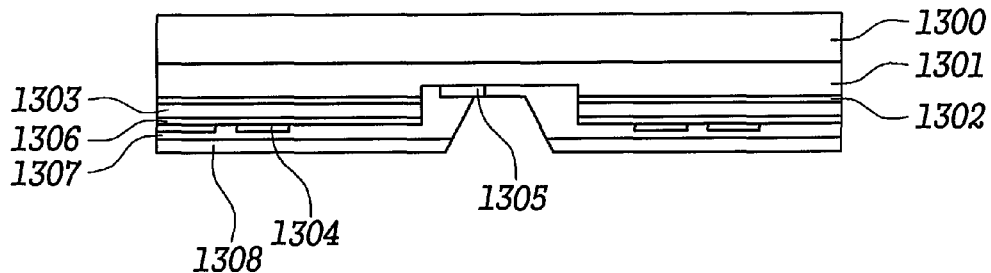
FIGS. 15 and 16 are schematic diagrams illustrating in sequence a method of manufacturing a light emitting diode with pad rearrangement according to another embodiment of the present invention.
Figure 16:
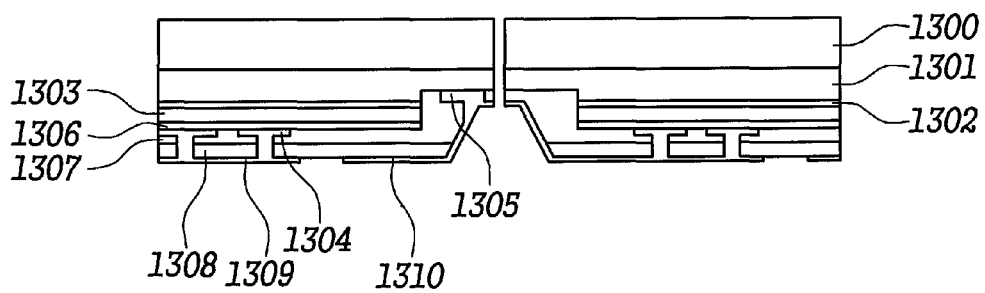

FIGS. 15 and 16 are schematic diagrams illustrating in sequence a method of manufacturing a light emitting diode according to another embodiment of the present invention.

Processes up to forming a first passivation layer 1307 and a second passivation layer 1308 of light emitting diode chips are similar to the overall processes of FIGS. 6 through 14.

FIG. 15 shows a method of etching to expose a first electrode 1305. According to FIG. 15, a light emitting diode is formed with mesa etching up to a first electrode 1305 which is formed relatively widely, thus having gradient of slope on the side face.

Next, referring to FIG. 16, the area that a second electrode 1304 is formed is etched and a p type electrode line extension 1309 is formed and connected to the second electrode 1304 through the etched area.

An n type electrode line extension 1310, being connected to the first electrode as n type, is formed along the slanted side face of the light emitting structure up to the upper face of a second passivation layer.

It is reasonable that the second electrode line extension 1309 as p type and the first electrode 1310 as n type are separated not to contact each other.

The above mentioned embodiment of the present invention shows dividing with scribing or dicing processes along the first electrode part as a boundary, thus making respective chips.

Figure 17:
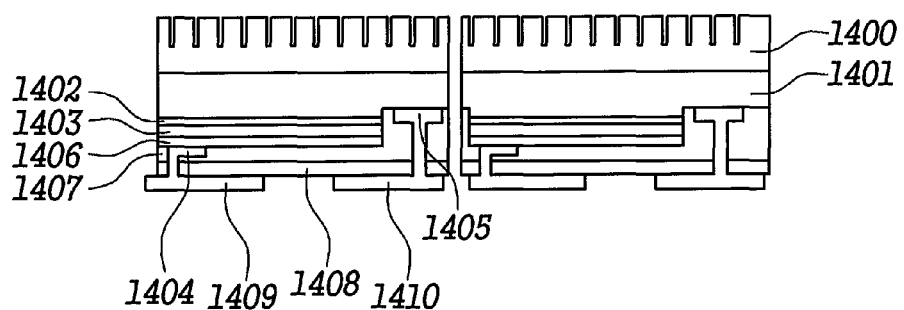
FIG. 17 is a cross-sectional view schematically illustrating a light emitting diode with pad rearrangement according to another embodiment of the present invention.

FIG. 17 schematically shows a light emitting diode chips, according to another embodiment of the present invention, having the structure of prominence and depression formed with texturing on the substrate processed as illustrated in FIGS. 6 through 16.

As illustrated FIG. 17, regular texturing structure may be applied, or roughening of random shape may be formed also.

Figure 18:
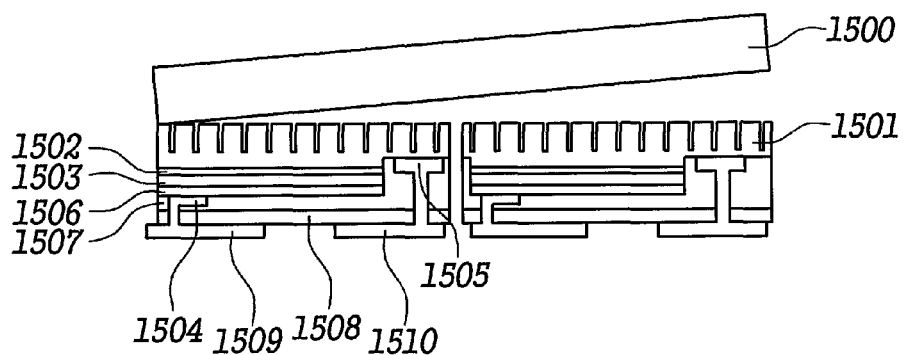
FIG. 18 is a cross-sectional view schematically illustrating a shape that a substrate is eliminated from a light emitting diode according to another embodiment with pad rearrangement of the present invention.

As another embodiment of the present invention, FIG. 18 shows texturing of the semiconductor layer exposed after a substrate is eliminated by processes such as LLO from a completed light emitting diode.

A method of eliminating substrate is not limited to LLO and any conventional arts, related to the method, a person having ordinary skill in the art will use may be applied.

As described above, the present invention is explained referring to various preferable embodiments; however, a person having ordinary skill in the art will appreciate that various modifications, additions and substitutions are possible, without departing from the scope and spirit of the invention as disclosed in the following claims.

The invention claimed is:
1. A method for making a light emitting diode, comprising;
   a first step of performing mesa-etching to reveal a designated area of a first semiconductor layer after forming the first semiconductor layer, an active layer and a second semiconductor layer on a substrate in sequence;

a second step of forming a reflector layer on the top of the second semiconductor layer left after the mesa-etching;

a third step of forming a first electrode(s) on the first semiconductor layer revealed by mesa-etching and a second electrode(s) on the upper face of the reflector layer;

a fourth step of forming a first passivation layer on the area excluding the first electrode(s) and the second electrode(s) to reveal the first electrode(s) and the second electrode(s); and a fifth step of forming a first bonding pad and a second bonding pad in the designated area on the top of the first passivation layer, connecting the first electrodes with a first bonding pad through one of more first electrode lines, and vertical extensions, in the shape of a metal pile, and connecting the second electrodes with a second bonding pad through one or more second electrode lines, wherein the first electrode(s) and second electrode(s) are formed on the same plane, further comprising a step of texturing regularly or irregularly the second electrode contacted directly with the second semiconductor layer under the reflector layer wherein the second electrode directly contacts the second semiconductor layer through opening(s) in the reflector layer.

2. The method according to claim 1, wherein the first passivation layer is formed with two films made of same or different material and is of such thickness as to provide sufficient rigidity to permit removal of the substrate.

3. The method according to claim 2, further comprising a sixth step of forming a second passivation layer on the part except the first electrodes, the second electrodes, the first bonding pad and the second bonding pad area.

4. The method according to claim 3, further comprising a step of removing the substrate of the first step, thus exposing membrane shape after the fifth step.

5. The method according to claim 1, wherein the total thickness of the formed passivation layer provides sufficient rigidity to permit removal of the substrate.

6. The method according to claim 5, further comprising a step of removing the substrate, thus exposing membrane shape after the fifth step.

7. The method according to claim 1, wherein the first semiconductor layer is it type; the second semiconductor layer is p type; and the first passivation layer is formed with one material or more selected from the group consisting of polyimide, epoxy resin and SOG.

8. The method according to claim 1, wherein the first semiconductor layer is n type and the second semiconductor layer is p type, further comprising a step of forming a second passivation layer made of glass or ceramic film in addition to the first passivation layer.

9. The method according to claim 1, wherein the first semiconductor layer is n type and the second semiconductor layer is p type, further comprising a step of forming glass or fluorescent layer after eliminating the substrate after the fifth step.

10. The method according to claim 1, wherein the first semiconductor layer is n type and the second semiconductor layer is p type, further comprising a step of texturing one side of the substrate to have regular or irregular prominence and depression after the fifth step.

11. The method according to claim 1, wherein the first semiconductor layer is n type and the second semiconductor layer is p type, further comprising a step of texturing one side of the semiconductor layer that was once adhered to the substrate to have regular or irregular prominence and depression after the fifth step.

12. The method of claim 1 wherein the first electrode is a n-electrode and has an angled side.

13. The method of claim 1 wherein the first and second bonding pads are in the same plane and adjacent the second semiconductor layer.

14. The method of claim 10 wherein the step of texturing comprises roughening to provide irregular prominences and depressions.

* * * * *